(12) United States Patent
Harder et al.

(10) Patent No.: US 10,627,467 B2
(45) Date of Patent: Apr. 21, 2020

(54) MODIFICATION OF MRI PULSE SEQUENCE PARAMETERS USING A HISTORICAL DATABASE

(71) Applicant: KONINKLIJKE PHILIPS N.V., Eindhoven (NL)

(72) Inventors: Tim Philipp Harder, Hamburg (DE); Thomas Netsch, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/093,742

(22) PCT Filed: Apr. 12, 2017

(86) PCT No.: PCT/EP2017/058840
§ 371 (c)(1),
(2) Date: Oct. 15, 2018

(87) PCT Pub. No.: WO2017/182369
PCT Pub. Date: Oct. 26, 2017

(65) Prior Publication Data
US 2019/0120920 A1 Apr. 25, 2019

(30) Foreign Application Priority Data

Apr. 21, 2016 (EP) .................................... 16166337
Jun. 3, 2016 (EP) .................................... 16172859

(51) Int. Cl.
*G01R 33/54* (2006.01)
*G06F 16/583* (2019.01)
*G06F 16/538* (2019.01)

(52) U.S. Cl.
CPC ......... *G01R 33/543* (2013.01); *G01R 33/546* (2013.01); *G06F 16/538* (2019.01); *G06F 16/583* (2019.01)

(58) Field of Classification Search
CPC .................................................... G01R 33/543
(Continued)

(56) References Cited

U.S. PATENT DOCUMENTS

6,690,961 B1 * 2/2004 Kaufman ............... A61B 5/055
600/410
7,254,623 B1 8/2007 Toth
(Continued)

*Primary Examiner* — Reena Aurora (57) ABSTRACT

The invention provides for a magnetic resonance imaging system (100) for acquiring magnetic resonance data (154) from an imaging zone (108). The magnetic resonance imaging system comprises: a memory (136) for storing initial pulse sequence commands (140) and machine executable instructions (160); and a processor (130) for controlling the magnetic resonance imaging system. Execution of the machine executable instructions causes the processor to receive (200) a set of selected pulse sequence parameters (142) comprising a definition of a region of interest (109) of a subject (118). The region of interest is within the imaging zone. Execution of the machine executable instructions further causes the processor to send (202) an image data request to a historical database (138). The image data request comprises the set of selected pulse sequence parameters. Execution of the machine executable instructions further causes the processor to receive (204) historical image data (146, 306, 308, 310, 312, 314, 402) from the historical database in response to the image data request. The historical database comprises multiple image data entries. Each image data entry comprises a set of historical pulse sequence parameters (502). The historical database is configured to search the historical database to retrieve the historical image data by matching the set of selected pulse sequence parameters to the set of historical pulse sequence parameters. Execution of the machine executable instructions further causes the processor to display (206) at least a portion (148) of the historical image data on a user interface. Execution of the machine executable instructions further causes the pro- (Continued)

cessor to receive (208) scan input modifications (150) in response to displaying the at least a portion of the historical image data on the user interface. Execution of the machine executable instructions further causes the processor to generate (210) modified pulse sequence commands (152) using the initial pulse sequence commands, the set of selected pulse sequence parameters, and the scan input modifications. Execution of the machine executable instructions further causes the processor to control (212) the magnetic resonance imaging system to acquire the magnetic resonance data using the modified pulse sequence commands.

14 Claims, 5 Drawing Sheets

(58) Field of Classification Search
USPC .......................................................... 324/307
See application file for complete search history.

(56) References Cited

U.S. PATENT DOCUMENTS

| | | |
|---|---|---|
| 9,568,578 B2 * | 2/2017 | Senegas ................ G01R 33/543 |
| 2003/0088173 A1 | 5/2003 | Kassai et al. |
| 2004/0148403 A1 | 7/2004 | Choubey et al. |
| 2006/0058635 A1 | 3/2006 | Lehtonen-Krause |
| 2006/0159219 A1 | 7/2006 | Kuth et al. |
| 2007/0260639 A1 | 11/2007 | Tobin et al. |
| 2013/0265044 A1 | 10/2013 | Senegas et al. |
| 2014/0088984 A1 | 3/2014 | Oh et al. |
| 2017/0053064 A1 | 2/2017 | Bhavani |

* cited by examiner

MODIFICATION OF MRI PULSE SEQUENCE PARAMETERS USING A HISTORICAL DATABASE

CROSS REFERENCE TO RELATED APPLICATIONS

This application is a U.S. national phase application of International Application No. PCT/EP2017/058840, filed on Apr. 12, 2017, which claims the benefit of EP Application Serial No. 16166337.2 filed Apr. 21, 2016 and EP Application Serial No. 16172859.7 filed on Jun. 3, 2016, each of which are incorporated herein by reference.

FIELD OF THE INVENTION

The invention relates to magnetic resonance imaging, in particular to the modification of pulse sequence parameters when acquiring magnetic resonance data.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by one or more transmitter coils cause a called B1 field. Additionally applied gradient fields and the B1 field cause perturbations to the effective local magnetic field. RF signals are then emitted by the nuclear spins and detected by one or more receiver coils. These RF signals are used to construct the MR images. These coils can also be referred to as antennas.

MRI scanners are able to construct images of either slices or volumes. A slice is a thin volume that is only one voxel thick. A voxel is a small volume element over which the MR signal is averaged, and represents the resolution of the MR image. A voxel may also be referred to as a pixel (picture element) herein if a single slice is considered.

United States patent application publication US 2014/0088984 A1 discloses medical imaging apparatus operates to automatically recommend protocols suitable for image capture of a subject based on information related to the subject, and a control method operates the medical imaging apparatus. The medical imaging apparatus includes a controller which determines one or more protocols to scan a subject, classifies the protocols based on plural predefined criteria, and aligns and recommends the protocols classified according to a selected criterion if any one of the plural criteria is selected, and a display unit which displays an array of the protocols recommended by the controller.

United States patent application publication US 2006/0058635 A1 discloses a a method and MR apparatus for acquisition of images of an examination region of a human or animal body by means of measurement parameter sets controlling the image acquisition, selection of an examination region to be acquired is made by a user according to anatomical viewpoints by means of a whole-body representation of an image element of the body (stored in a storage region for image data) on a monitor. A list of measurement parameter sets for the selected region is displayed on the monitor, with the measurement parameter sets in the list each being shown with at least one region-specific image element (stored in a storage region) of an acquisition result that can be obtained with this measurement parameter set. A measurement parameter set for image acquisition is then selected.

European patent application publication EP 1 229 472 A4 discloses an MRI system center is connected through the electronic communication circuit to a plurality of MRI systems for converting the inside of a sample into video signals using magnetic resonance. The MRI system center receives data of a log file storing the usage of the MRI system, or usage data extracted from the log file, from the MRI systems through a communication control unit. A database unit stores the data of the log file or the usage data. An analysis unit analyzes the data of a log file or the usage data received within a predetermined period of time.

United States patent application publication US 2004/0148403 A1 discloses a technique for sharing clinical protocols for diagnostic imaging systems. The clinical protocols generally represent operational parameters, such as configuration data and procedures, which are clinically developed for a particular imaging diagnosis. An interface or access point, such as a network accessible database or website, is provided to facilitate the exchange of these clinical protocols between clinicians. The present technique also may facilitate the formation of new clinical protocols and/or the integration of new clinical protocols into various diagnostic imaging systems. Accordingly, clinicians can electronically exchange and configure a variety of imaging protocols for potentially greater quality in the particular imaging diagnosis.

SUMMARY OF THE INVENTION

The invention provides for a magnetic resonance imaging system, a method, and a computer program product in the independent claims. Embodiments are given in the dependent claims.

When acquiring a magnetic resonance image pulse sequences or pulse sequences commands are used to control the operation and timing of various components of the magnetic resonance imaging system. In a clinical setting a physician or operator will have a number of pulse sequences that are preconfigured for various types of examinations. Very often, this is sufficient to obtain good imaging results. However, sometimes non-standard regions of a subject need to be imaged or for other reasons the pulse sequence needs to be modified: The subject could have an abnormal anatomy or the imaging requirement is not normally performed at the clinical site. This can be very problematic because the pulse sequence has a large number of parameters which can be varied. The timings and values of various parameters which can be adjusted in a pulse sequence are referred to herein as "pulse sequence parameters."

When faced with a non-standard imaging requirement it can be difficult to obtain useful images because the operator may have to repeatedly modify the pulse sequence parameters and then acquire the magnetic resonance data and reconstruct the magnetic resonance data into images to see what the result is.

Embodiments of the invention may provide for a means of reducing the need to physically operate the magnetic resonance imaging system to test the effects of a particular set of pulse sequence parameters. In embodiments a selected set of pulse sequence parameters are used to query a database of historical image data. Techniques such as cluster analysis can be used to retrieve historical image data from one or more historical magnetic resonance imaging scans. In some embodiments the resulting data comprises historical images which the user of the magnetic resonance imaging system can use to estimate the results of using the selected pulse sequence parameters. The operator can look at one or more images and choose an image that is identical to the selected scan parameters or possibly even select one of several images with a cluster of images. This can be used for a guide in improving the selected scan parameters or in training the operator to modify the scan parameters in a way which provides suitable clinical images.

In other embodiments, the historical image data may contain meta-data. The meta-data may contain information such as concrete properties such as signal to noise, contrast to noise, and/or scan time. This may allow an operator or an algorithm to automatically select changes to the scan parameters to optimize factors such as the scan time to contrast without having to perform any preliminary scans.

In other embodiments, the meta-data can comprise a rating how well an image processing algorithm such as an automatic segmentation algorithm or a measurement algorithm worked on the historical image.

As a concrete example of this, it may be desired to measure the size and/or number of tumors within a subject. The image contrast and signal to noise may affect how well or accurately an automated segmentation might perform this task. It a clinical setting it would be nearly impossible to modify the standard pulse sequence that is used and expect this to work efficiently. One would have to image the subject and then apply the segmentation algorithm and then assess if the algorithm had worked properly. By the time that all of these tasks have been accomplished the subject could have left the examination area. Using meta-data to rate the historical images for success of the segmentation algorithm provides a means of effectively predicting if a set of scan parameters will provide good results when the segmentation algorithm is applied.

In one aspect the invention provides for a magnetic resonance imaging system for acquiring magnetic resonance data from an imaging zone. The magnetic resonance imaging system comprises a memory for storing initial pulse sequence commands. The magnetic resonance imaging system further comprises a processor for controlling the magnetic resonance imaging system. Execution of the machine-executable instructions cause the processor to receive a set of selected pulse sequence parameters comprising a definition of a region of interest of a subject. The region of interest is within the imaging zone. The set of selected pulse sequence parameters may be received from a user via a user interface or they may also be completely or partially a predetermined set of selected pulse sequence parameters that are selected from a menu or provided by a selection from a repository of different pulse sequence parameters. For example the set of selected pulse sequence parameters may be a so called exam card or predefined scan parameters that are then modified by a user.

Execution of the machine-executable instructions further cause the processor to send an image data request to a historical database using the set of pulse sequence parameters. The image data request comprises the set of selected pulse sequence parameters. In some examples the historical database may be local to the magnetic resonance imaging system. In other cases the historical database may be located at a remote location in a server or also may be in the cloud.

In some examples, the image data request may be considered to be a database query of the historical database.

Execution of the machine-executable instructions further cause the processor to receive historical image data from the historical database in response to the image data request. The historical image data may take different forms in different examples. In one example the historical image data may comprise an image. In other examples the historical image data may comprise meta-data which is descriptive of an image. In yet other examples the historical image data may comprise an image plus meta-data descriptive of the image. Execution of the machine-executable instructions further cause the processor to display at least a portion of the historical image data on a user interface. In some examples this may take the form of retrieving and displaying a particular historical image. In other examples the meta-data descriptive of the historical image may also be displayed in addition to or as an alternative to the image. In other examples the meta-data is displayed by altering the appearance of an object or image on a user interface. For example the success of a particular segmentation algorithm could be used to modify the appearance of a "traffic light" like object which shows a green light if the historical image data indicates that a particular segmentation algorithm was successful in meta-data of the received historical image data.

Execution of the machine-executable instructions further cause the processor to receive scan input modifications in response to displaying the historical image data from the user interface. In some examples the user may see the historical image data displayed and then manually enter using the user interface data which is then used to modify the pulse sequence commands. In other examples the scan input modifications may be received automatically by using or partially using some of the scan input modifications or pulse sequence parameters which are identified as meta-data in a historical image data.

In another embodiment, the execution of the machine executable instructions causes the processor to reconstruct a magnetic resonance image from the magnetic resonance data.

In another embodiment, execution of the machine-executable instructions further cause the processor to generate modified pulse sequence commands using the initial pulse sequence commands, the set of pulse sequence parameters, and the scan input modifications.

In one example, the initial pulse sequence commands can be thought of as a template or generic pulse sequence, which is then, modified using the set of pulse sequence parameters and the scan input modifications.

Execution of the machine-executable instructions further causes the processor to control the magnetic resonance imaging system to acquire the magnetic resonance data using the modified pulse sequence commands.

This embodiment may be beneficial because it may reduce the number of times a magnetic resonance imaging system needs to be run to acquire quality images of a subject. The historical database enables historical image data to be retrieved. Another potential benefit of this embodiment is that it may be faster to retrieve the historical image data than it would be to make a trial acquisition with a magnetic resonance imaging system. By comparing the historical image data directly or by comparing it to other images it can be determined if a particular set of pulse sequence parameters will be successful in imaging a subject or not.

In another embodiment the initial pulse sequence commands comprises adjustable timings and adjustable parameters.

In another embodiment the initial pulse sequence commands are a template for the adjustable timings and the adjustable parameters.

In another embodiment the set of selected pulse sequence parameters comprises the adjustable timing of the initial pulse sequence commands and the adjustable parameters of the initial pulse sequence commands.

In another embodiment the set of selected pulse sequence parameters at least partially comprises the adjustable timing parameters of the initial pulse sequence commands and/or at least partially comprises the adjustable parameters of the initial pulse sequence commands In another embodiment the region of interest is configured for being within the imaging zone.

In another embodiment, the set of selected pulse sequence parameters may also include such data descriptive of the subject such as height, BMI or body mass index, age, sex, and/or weight. This may be helpful in refining and choosing historical image data from the historical database that more closely matches a particular subject.

In another embodiment, the selected pulse sequence parameters may also include a hardware configuration of the magnetic resonance imaging system. For example there may be cases where the historical database stores historical data from several different types or configurations of magnetic resonance imaging systems.

In another embodiment, the historical database comprises multiple image data entries. Each image data entry comprises a set of historical pulse sequence parameters. The historical database is configured to search the historical database to retrieve the historical image data by matching the set of selected pulse sequence parameters to the set of historical pulse sequence parameters. In some examples this may be used to retrieve an image with an identical set of pulse sequence parameters. However, it may be possible that the historical database does not have an image with a particular scan geometry and parameters which match the set of selected pulse sequence parameters exactly. In this case the database may be searched for historical image data that lays within a certain neighborhood or matches certain parameters of the set of selected pulse sequence parameters. This may be accomplished in different ways. In one case there may be a weighting assigned to each of the parameters and this may be used to search and select the historical image data.

In another embodiment, the historical database is configured to return a no-result if a match within a particular threshold of parameters is not found or returned. This may be a useful feature to indicate a poor choice of selected pulse sequence parameters. Instead of just blindly returning the closest result, if the result is above a particular threshold then a no-result is returned and then the physician or operator of the magnetic resonance imaging system should be more cautious with proceeding.

In another embodiment, matching the set of selected pulse sequence parameters to the set of historical pulse sequence parameters is performed using a clustering algorithm. The clustering algorithm can for example work by using a distance metric or a measure that is defined in terms of the various scan parameters. Some parameters count more than others and may therefore count more in the search. In other examples a proximity matrix is used to determine the clustering.

In another embodiment, the historical database comprises a closest historical image. This may be considered to be the image which has pulse sequence parameters that closely match the selected pulse sequence parameters using a particular metric or measure.

In another embodiment, the historical database is configured for selecting the closest historical image by comparing the pulse sequence parameters to the set of historical pulse sequence parameters using a metric or measure.

In another embodiment, execution of the machine-executable instructions cause the processor to display the closest historical image on the user interface. This embodiment may be beneficial because it may provide for a means of seeing how a magnetic resonance imaging scan will result before performing the scan.

If there is already an image shown on the user interface then this may also include aligning or scaling the closest historical image to match the existing image. For example, a survey scan may have been performed and the closest historical image may be scaled and/or aligned with the survey scan. The same may be for a previously acquired image. For example, this may also be useful in the case where the magnetic resonance imaging system was used to acquire a magnetic resonance image and then for some reason the image was deemed to be of insufficient quality. The historical database could then be used by the operator of the magnetic resonance imaging system to search for an image which would provide a better result before the image is actually acquired.

In another embodiment, the historical image data comprises multiple historical images. The step of displaying at least a portion of the historical image data on the user interface comprises displaying the multiple historical images on the user interface.

It should be noted that the closest historical image may be one of the multiple historical images.

Displaying the multiple historical images on the user interface may be beneficial because it may enable the operator to see the effect of changing a number of parameters at once. For example, if a clustering algorithm is used to search for the multiple historical images a cluster or group of images around the selected pulse sequence parameters may be selected. The operator can then examine the multiple historical images and this choice can be used to select or correct the selected pulse sequence parameters.

In another embodiment, each of the multiple historical images comprises meta-data. The step of receiving scan input modifications in response to displaying the historical image data on the user interface comprises a selection of one of the multiple historical images. Execution of the machine-executable instructions further causes the processor to update the set of selected pulse sequence parameters using the set of historical pulse sequence parameters.

This may be beneficial because it may provide for a means of correcting the selected pulse sequence parameters automatically. When updating the pulse sequence parameters some values from the historical database or in the meta-data may be ignored and some may be used. For example the parameters might be identified as giving a high weight and when the image is selected these are then propagated or copied into the set of selected pulse sequence parameters. These may include, but are not limited to, TR, TE, TSE factor, the SENSE factor, or other key parameters of the pulse sequence.

In another embodiment, execution of the machine-executable instructions further causes the processor to automatically highlight one of the multiple historical images on the user interface by using a selection criterion and the meta-data. For example, the selection criterion might be pre-programmed or be able to be selected by the user. These may include certain properties of the magnetic resonance image such as the contrast or contrast-to-noise. The selection criterion also might contain a physical property of the pulse sequence such as the scan time. This embodiment may be very beneficial because it may provide for a means of automatically selecting the third image from the set of historical images. The system automatically selects the proper image and it is simply highlighted, the user need only confirm the choice.

In another embodiment, execution of the machine executable instructions further causes the processor to automatically highlight of one of the multiple historical images on the user interface by searching the meta-data for each of the multiple historical images for a best value that matches a selection criterion. The best value is the meta-data for the one of the multiple historical images. The selection criterion may for example be to select the meta-data which most closely matches a predetermined meta-data value or combination of values.

In another embodiment, each of the multiple historical images comprises meta-data. Execution of the machine-executable instructions further causes the processor to automatically selected one of the multiple historical images using a selection criterion and the meta-data. Execution of the machine-executable instructions further causes the processor to update the set of selected pulse sequence parameters using the set of historical pulse sequence parameters. In this embodiment, the process is fully automated. This may be useful in a situation where the operator of the magnetic resonance imaging system has insufficient time to examine all the images or may not be sufficiently trained.

In another embodiment, execution of the machine executable instructions further causes the processor to automatically highlight of one of the multiple historical images on the user interface by searching the meta-data for each of the multiple historical images for a best value that matches a selection criterion. The best value is the meta-data for the one of the multiple historical images. The selection criterion may for example be to select the meta-data which most closely matches a predetermined meta-data value or combination of values.

In another embodiment, the meta-data comprises any one of the following: scan time, signal-to-noise, contrast, contrast-to-noise, the success of a pre-selected segmentation algorithm, the success of a predetermined measurement algorithm, and combinations thereof. The images in the historical database could be processed for these parameters ahead of time and it is simply data that may be searched for. The inclusion of the success of the segmentation algorithm or the measurement algorithm may be particularly beneficial. When a human examines an image it may not be clear to the human if the segmentation algorithm will function properly or not. The images or image data in the historical database can be classified as to whether particular algorithms function well or not. This may provide a time savings as it may not otherwise be known whether an algorithm will be successful until the scan has been performed and the algorithm has been executed.

In another embodiment execution of the machine-executable instructions further cause the processor to arrange multiple historical images on the user interface along one or more axes determined by the meta-data. For example the images may be arranged on one or more axes and the position on the axis may indicate the value of a particular element or item of meta-data. This may enable the easy sorting of the multiple historical images to enable selection of the proper image. In some cases the meta-data used for sorting the images arranged on the one or more axes includes an image property such as signal to noise or contrast to noise. In other cases the meta-data used for sorting the images on the one or more axes includes a scan parameter or a variable in a pulse sequence. In yet other cases the meta-data or a property of the magnetic resonance acquisition is used for sorting the images arranged on the one or more axes. For example the scan time needed to acquire an image may be used to sort the images.

In another embodiment, the meta-data comprises scan time. Execution of the machine-executable instructions causes the processor to arrange the multiple historical images on the user interface along a scan time axis. This embodiment may be particularly beneficial because it is not always known or obvious how long the scan time is. Also, it may be beneficial to arrange images along a scan time axis because it may enable comparison of other properties such as the signal-to-noise versus the scan time used. This may enable an operator to choose a trade-off between the so-called image quality and the scan time easily. This is something which is not easily accomplished.

In another embodiment execution of the machine-executable instructions further cause the processor to generate preliminary pulse sequence commands using the initial pulse sequence commands. Execution of the machine-executable instructions further cause the processor to control the magnetic resonance imaging system to acquire preliminary magnetic resonance data using the preliminary pulse sequence commands. Execution of the machine-executable instructions further cause the processor to reconstruct a preliminary magnetic resonance image using the preliminary magnetic resonance data. Execution of the machine-executable instructions further cause the processor to display the preliminary magnetic resonance image on the user interface. Execution of the machine-executable instructions further cause the processor to receive an image correction request from the user interface in response to displaying the preliminary magnetic resonance image. The sending of the image data request to the historical database is made in response to receiving the image correction request.

In this embodiment, the request or the image data request was sent to the historical database in response to a preliminary magnetic resonance image being rejected. This may be beneficial in reacquiring the magnetic resonance image so that it may be useful in a clinical or diagnostic setting.

In another embodiment, the magnetic resonance imaging system comprises the historical database.

In another embodiment, the processor communicates with the historical database via a network connection. For example, the historical database may be located on a remote server or may be located in the cloud.

In another embodiment, the historical database is any one of the following: a relational database, a document orientated database, an object relational database, or a key-value store database.

In another embodiment, execution of the machine-executable instructions may first comprise acquiring survey magnetic resonance data and taking a survey magnetic resonance image first. The images from the historical database can then be aligned or scaled so that they match the survey image so that the operator has an idea of how the acquired magnetic resonance image will look after it has been acquired.

In another embodiment, the process may be repeated over and over again. For example, once the historical medical image data has been retrieved, the user may then go through and modify the set of selected pulse sequence parameters and the process may be repeated. This may be useful for an operator to search for better image characteristics or may be useful in training. For example the user sets the scan parameters and then retrieves one or more historical images. If the user does not like them the user changes the scan parameters and repeats the process.

In another aspect, the invention provides for a computer program product comprising machine-executable instructions for execution by a processor. Execution of the machine-executable instructions causes the processor to receive a set of selected pulse sequence parameters comprising a definition of a region of interest of a subject. Execution of the machine-executable instructions further cause the processor to send an image data request to a historical database using the set of pulse sequence parameters. The image data request comprises the pulse sequence parameters. Execution of the machine-executable instructions further causes the processor to receive historical image data from a historical image database in response to the image data request. Execution of the machine-executable instructions further causes the processor to display at least a portion of the historical image data on the user interface. This example may be beneficial because it may enable an operator to select image protocol before an examination is started. It may also be useful in training operators so that they have a feel for how the image quality changes as various pulse sequence parameters are varied.

In another embodiment, execution of the machine-executable instructions further causes the processor to receive scan input modifications in response to displaying the historical image data from the user interface. These may be automated or they may be received from a user interface. Execution of the machine-executable instructions further causes the processor to generate modified pulse sequence commands using the initial pulse sequence commands, the set of pulse sequence parameters, and the scan input modifications. Execution of the machine-executable instructions further cause the processor to control the magnetic resonance imaging system to acquire the magnetic resonance data using the modified pulse sequence commands.

In another aspect, the invention provides for a method of operating a magnetic resonance imaging system. The method comprises receiving a set of selected pulse sequence parameters comprising a definition of a region of interest of a subject. The region of interest is within the imaging zone. The method further comprises sending an image data request to a historical database using the set of pulse sequence parameters. The image data request comprises the pulse sequence parameters. The method further comprises receiving historical image data from the historical database in response to the image data request. The method further comprises displaying at least a portion of the historical image data on a user interface.

The method further comprises receiving scan input modifications in response to displaying the historical image data from the user interface. The method further comprises generating modified pulse sequence commands using the initial pulse sequence commands, the set of pulse sequence parameters, and the scan input modifications. The method further comprises controlling the magnetic resonance imaging system to acquire the magnetic resonance data using the modified pulse sequence commands.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface. A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical image data. A Magnetic Resonance (MR) image is defined herein as being the reconstructed two or three dimensional visualization of anatomic data contained within the magnetic resonance imaging data. This visualization can be performed using a computer.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these Figs are either equivalent elements or perform the same function. Elements which have been discussed previously will not necessarily be discussed in later Figs if the function is equivalent.

Figure 1:
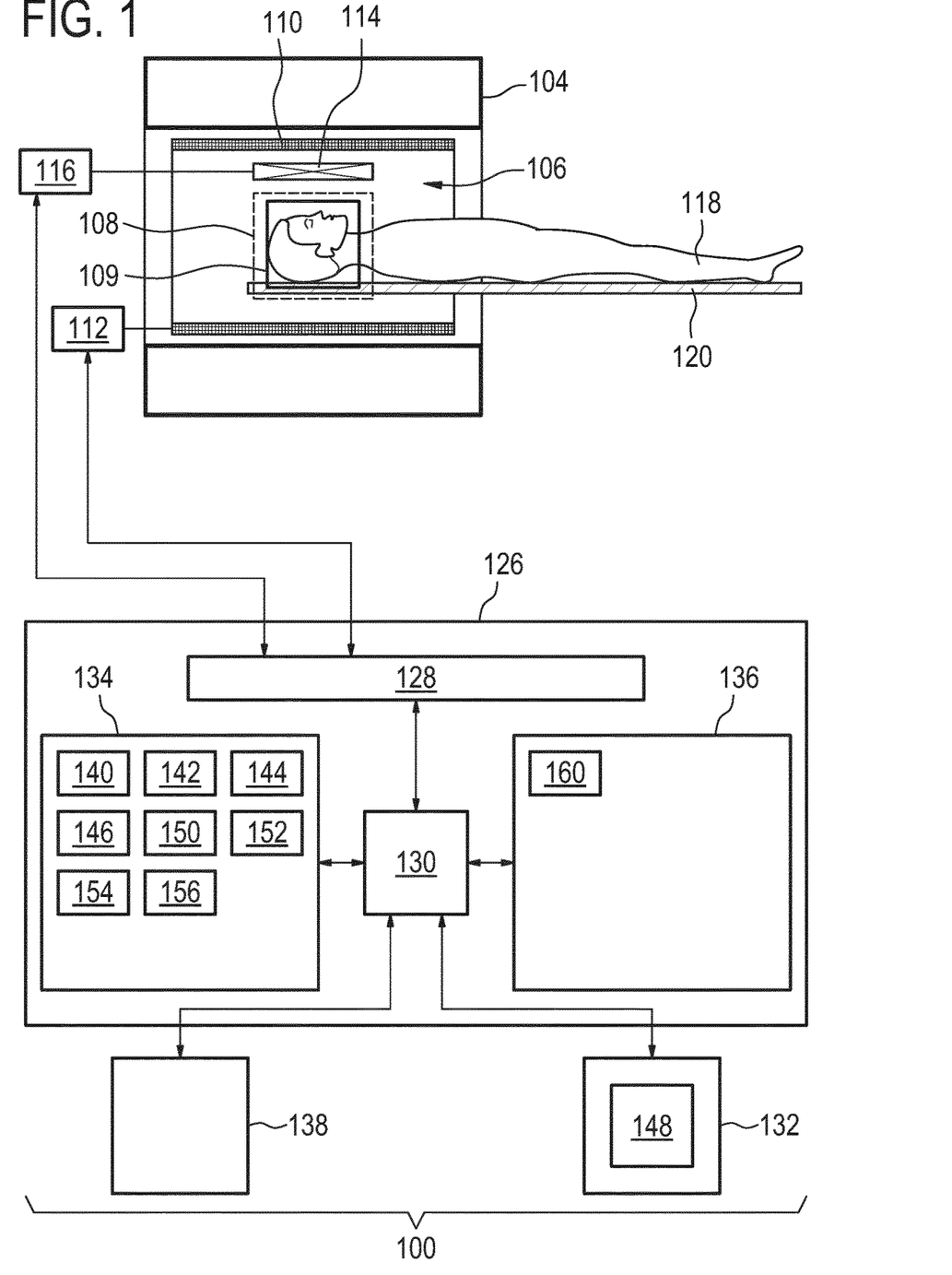
FIG. 1 illustrates an example of a magnetic resonance imaging system.

FIG. 1 shows an example of a magnetic resonance imaging system 100. The magnetic resonance imaging system 100 comprises a magnet 104. The magnet 104 is a superconducting cylindrical type magnet 104 with a bore 106 through it. The use of different types of magnets is also possible. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientation of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receiver. The radio-frequency coil 114 may also have multiple receive/transmit elements and the radio frequency transceiver 116 may have multiple receive/transmit channels.

Within the bore 106 of the magnet 104 there is a subject support 120 which supports the subject in the imaging zone 108. A region of interest 109 can be seen within the imaging zone 108.

The transceiver 116, the magnetic field gradient coil power supply 112 are seen as being connected to a hardware interface 128 of computer system 126.

The computer 126 further comprises a processor 130, a user interface 132, computer storage 134, and computer memory 136. The hardware interface 128 enables the processor 130 to send and receive commands and data in order to control the functioning of the magnetic resonance imaging system 100. The processor 130 is further connected to the user interface 132, the computer storage 134, and the computer memory 136.

The contents of the computer storage 134 and the computer memory 136 may be interchangeable. In some examples the contents of the computer storage 134 may be duplicated in the computer memory 136.

The processor 130 is also shown as being connected to a historical database 138. The historical database 138 may be part of the computer system 126 or it may be located at a remote location. For example the processor 130 may communicate with the historical database 138 via a network connection. The historical database 138 may for example be a server which hosts a database or a relational database. The historical database 138 is configured to be queried by using at least the set of selected pulse sequence parameters 142. Other parameters such as the height, BMI, age, sex, weight and a hardware configuration of the magnetic resonance imaging system 100 may also be used to at least partially construct queries for the historical database 138.

The computer storage 134 is shown as containing initial pulse sequence commands 140. The computer storage 134 is further shown as containing a set of selected pulse sequence parameters 142. The computer storage 134 is further shown containing an image data request 144. The computer storage 134 is further shown as containing a historical image data 146 that was received from the historical database 138 in response to the image data request 144. The computer storage 134 is further shown as containing a portion of historical image data 148 displayed on the user interface 132. The computer storage 134 is further shown as containing scan input modifications 150 that were received from the user interface 132 in response to displaying the portion of the historical image data 148.

The computer storage 134 is further shown as containing modified pulse sequence commands 152 that were generated from the initial pulse sequence commands 140 by modifying them with the scan input modifications 150. The computer storage 134 is further shown as containing magnetic resonance data 154 that was optionally acquired with the modified pulse sequence commands 152 being used to control the magnetic resonance imaging system 100. The computer storage 134 is further shown as containing a magnetic resonance image 156 that was reconstructed from the magnetic resonance data 154.

The computer memory 136 is shown as containing machine-executable instructions 160 which enable the processor 130 to control and operate the magnetic resonance imaging system 100.

Figure 2:
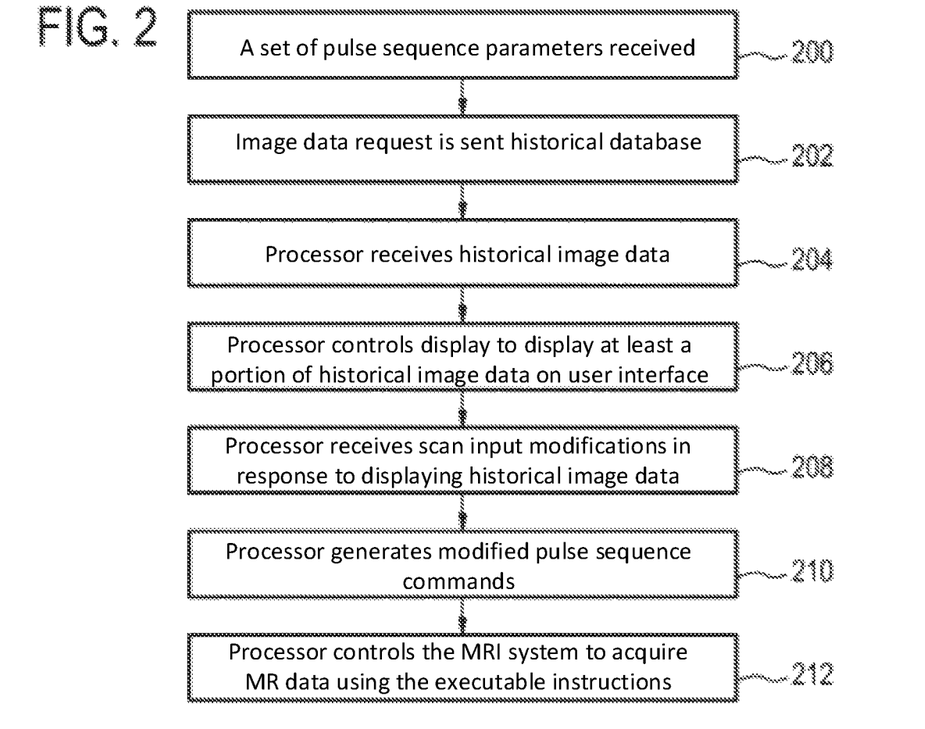
FIG. 2 shows a flow chart which illustrates a method of using the magnetic resonance imaging system of FIG. 1.

FIG. 2 shows a flowchart which illustrates a method of operating the magnetic resonance imaging system 100 of FIG. 1. The steps in the flowchart in FIG. 2 may for example illustrate at least partially the actions performed by the machine-executable instructions 160.

First in step 200, a set of selected pulse sequence parameters 142 are received. The set of selected pulse sequence parameters comprise a definition of the region of interest 109 of the subject 118. The region of interest 109 is within the imaging zone 108. Next in step 202 an image data request 144 is sent to the historical database 138. The image data request may comprise the set of pulse sequence parameters 142. Next in step 204, the processor 130 receives historical image data 146 from the historical database 138 in response to the image data request 144.

Next in step 206 the processor 130 controls the display to display at least a portion 148 of the historical image data on the user interface 132. The historical image data can include different types of data. For example the historical image data may include, but is not limited to: historical images, meta-data, and or pulse sequence parameters for the historical images. Next in step 208, the processor 130 receives scan input modifications 150 in response to displaying the historical image data 148 on the user interface 132. Next in step 210 the processor 130 generates modified pulse sequence commands 152 using the initial pulse sequence commands 140, the set of selected pulse sequence parameters and the scan input modifications 150. Finally in step 212 the processor controls the magnetic resonance imaging system 100 to acquire the magnetic resonance data 154 using the machine-executable instructions 160.

The example illustrated in FIGS. 1 and 2 may be modified. For example for the use in training or in planning before a medical scan the computer system 126 in conjunction with the historical database 138 and the display 132 may be used alone. For example steps 200, 202, 204, and 206 may be performed using a computer system independent of the rest of the components of the magnetic resonance imaging system. These steps 200-206 may be repeated a number of times. This may be useful in planning and also in training operators how to modify the scan parameters for particular image qualities.

Figure 3:
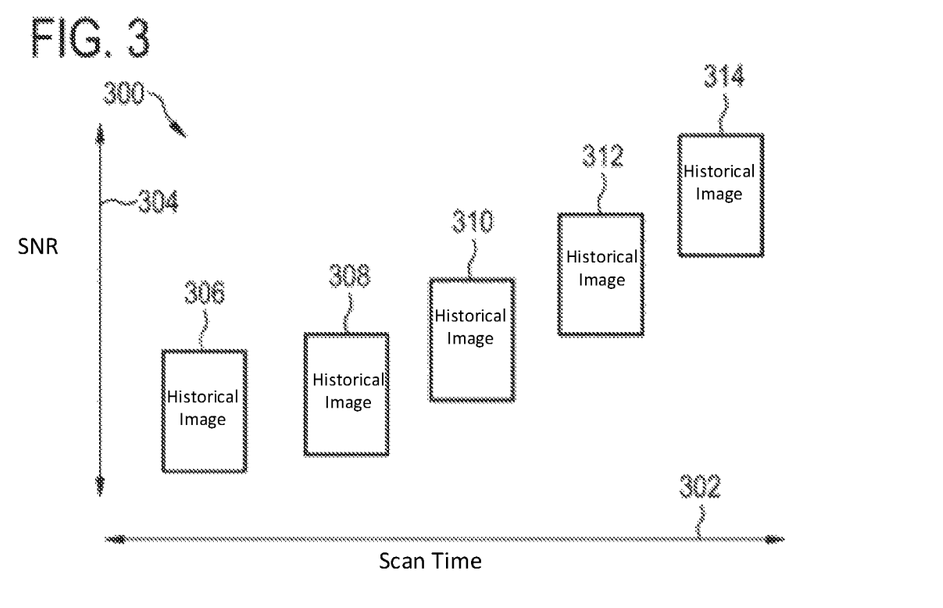
FIG. 3 illustrates part of a user interface.

FIG. 3 shows an example of a portion 300 of the user interface display. In this portion 300 of the user interface display there is a first meta-data access 302 and a second meta-data access 304. There are then a number of historical images 306, 308, 310, 312, and 314 arranged. They are arranged such that their position indicates the value of the meta-data 302, 304 for that particular image 306, 308, 310, 312, 314. For example access 302 could be scan time and access 304 could be a parameter such as signal-to-noise or contrast-to-noise. This may provide a ready means which allow an operator to examine the trade-offs associated with one of the meta-data parameters 302, 304.

MRI scans or pulse sequences may be defined by hundreds of carefully crafted parameters or scan parameters. Usually predefined pulse sequences, which may be referred to as "ExamCards" herein, for different anatomies and use cases can be readily used, but there are situations where radiologists adopt parameters to optimize image contrast or scan time. Unfortunately, a sub-optimal parameter setting can only be identified after the corresponding image is acquired, as a result, the scan may have to be repeated with some initial setting again, resulting in additional cost and reduced patient comfort and throughput.

Examples may provide a visual support system retrieving representative overview images from previous acquisitions (different sites, different patients) with a comparable set of parameters. The scan parameters and overview images are stored in a central database, ideally on Philips HSDP, and a standard clustering algorithm defines clusters of most similar scans by means of data mining. Ideally the entire MRI installed based would be connected to the platform. In the example workflow, the system retrieves a representative image/overview of the most similar parameter cluster allowing to instantly get a visual feedback of the expected result of an updated scan parameter prior execution of the actual scan.

In radiology, it is estimated that worldwide more than 30 Mio MRI examinations are acquired every year. As a result, every day, very similar imaging protocols and anatomies are repeated many hundred times and despite imaging different patients with different indications, these images will look very much alike. A radiologist at a particular site, however, only sees a small fraction of those images.

MRI scanners are a large investment for hospitals and even more for smaller radiology practices. This might be a reason why many radiologist have a tendency to not update the system as long as it is running. Many scanners have never had a software update let alone more substantial changes such as hardware upgrades.

A typical MR image acquisition may possibly be defined by a few hundred parameter that can be modified in the scanning console prior to the scan. Usually those parameters describe carefully crafted pulse sequences leading to a large variety of contrasts. In the case of Philips systems, these parameter sets are stored in the form of ExamCards on each scanner. The effect of updating a single parameter is often hard to predict, even for experienced radiologists. In clinical practice, scans frequently have to be repeated, if the parameter change does not has to anticipated improvement with respect to image contrast or total scan time.

Quality control on the other hand is an increasingly important topic for health care providers today. In many countries national regulations already demand seamless documentation or such regulation are currently being prepared. Ensuring the current working procedures are in fact leading to good imaging results is a cumbersome and manual process.

Figure 4:
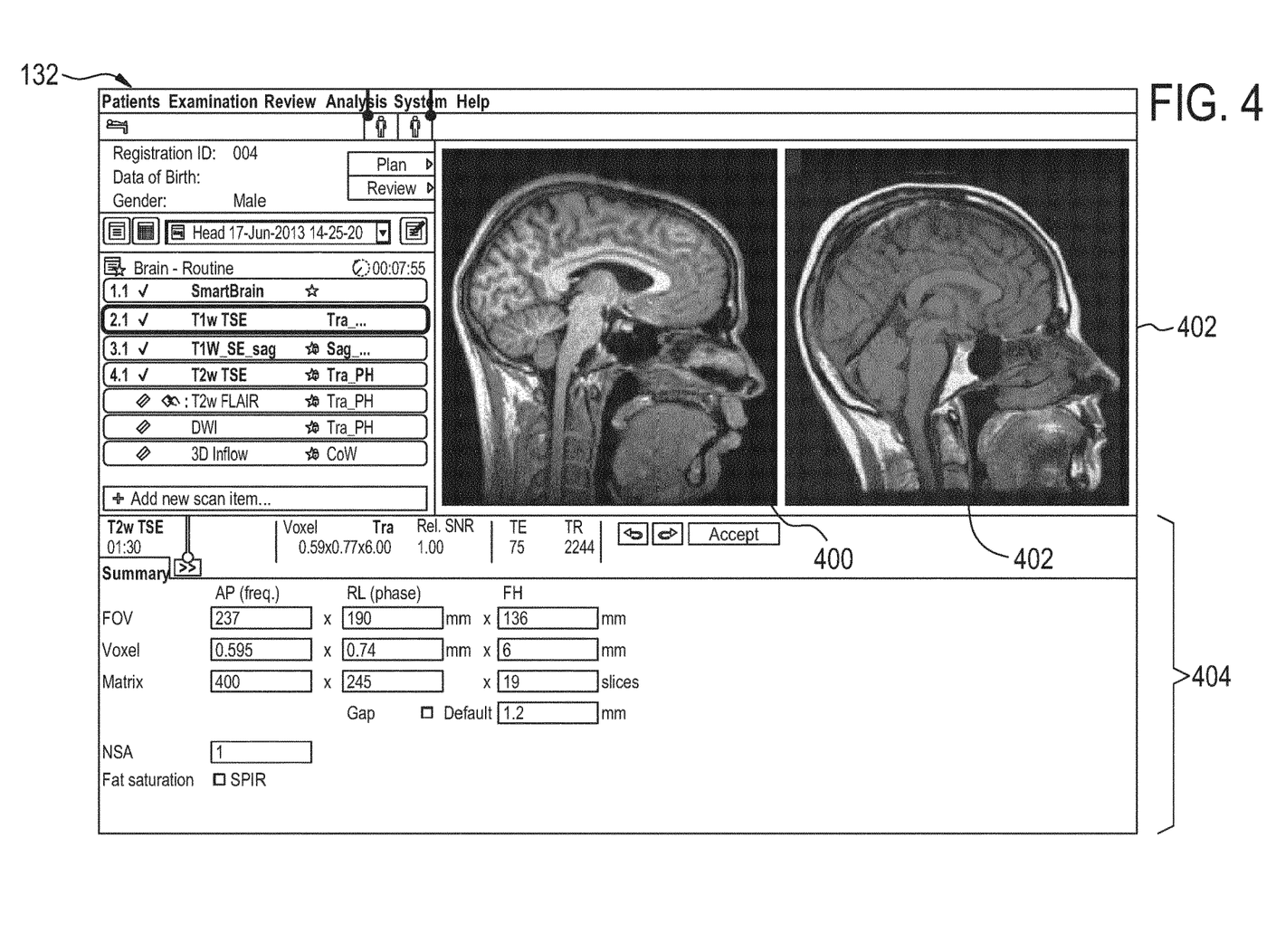
FIG. 4 illustrates a user interface.

FIG. 4 illustrates an example of a user interface 132. The user interface 132 shows two images. The image 400 shows an acquired magnetic resonance image 400. The image 400 shows a central slice of an acquired magnetic resonance imaging brain scan. This may for instance be done using a set of predetermined or canned scan settings for a pulse sequence. The user interface 132 has a portion 404 which has boxes and controls which enable a user to change the scan parameters.

The portion of the user interface 404 enables the operator to input the set of selected pulse sequence parameters 142. The image 402 shows a historical image 402 that was retrieved from the historical database 138 in response to the input that the user put into the portion of the interface 404. The images 400 and 402 are from different people however the scan anatomy in 402 is similar to that in 400. It would give an operator a good idea of what the image 400 would look like when the scan parameters input into the portion 404 are used. In some other examples the image 402 may be registered to the image 400 and the position of the image 402 may be modified such that the images seem more similar. In other examples the registration between 402 and 400 may also be used to deform the image 402 so that it more closely resembles the image 400.

FIG. 4 further shows the implementation of an example of an MRI scanner console or user interface. The left image 400 shows a central slice of an acquired MRI brain scan (current parameter setting in ExamCard). After the user changes a scan parameter (in the window below the images) the image is updated (right image 402) according to the new setting. Apparently, the grey/white matter contrast is influenced by the parameter update. It is possible that in some examples, the image anatomy be not exactly the same when compared to the current scan, since the clustering algorithm selects images from different patients/sites.

In some examples a visual guidance system for radiologists is provided when updating the parameter of an ExamCard or of a single scan. The radiologist can see how the image appearance (i.e. contrast, noise, representation of structures such as bones, fat, white matter) and total scan time will change caused by the parameter modification prior to the scan. Hence the radiologist will be able to better judge the effect of the change or he will be able check quality issues or scheduling constraints just before the actual scan is acquired. This will also help to reduce the number of wrongly parameterized scans which have to be re-done later on. FIG. 4 shows how the scanner UI may look like.

There is currently no known algorithm that directly calculates or simulates image appearance for a given set of scan parameters. Examples may therefore use a kind of data mining approach searching in a database for similar scans and using corresponding, already acquired images for presentation to the radiologist.

Figure 5:
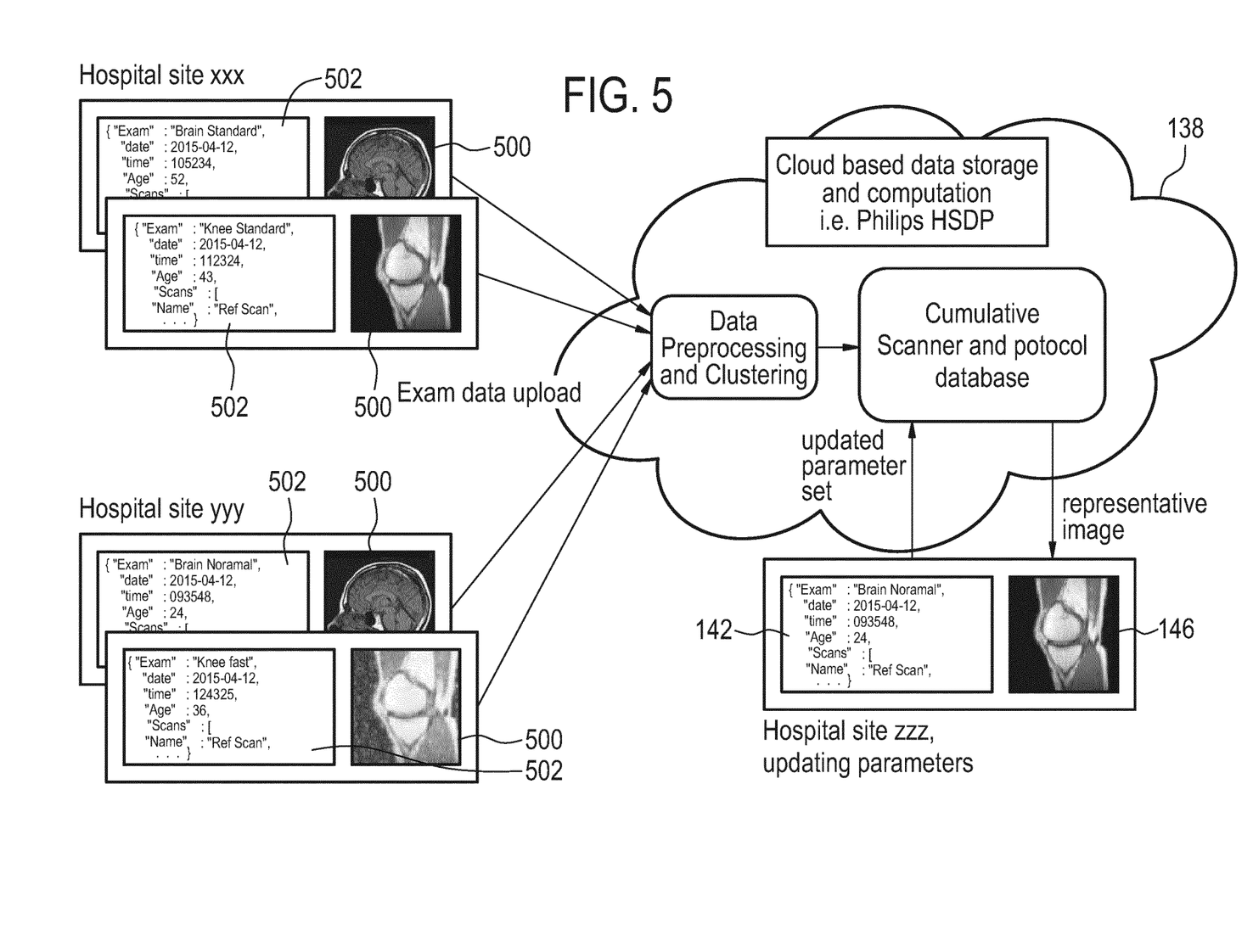
FIG. 5 illustrates the interaction between a computer system and a historical database.

FIG. 5 illustrates the data collection and retrieval by the historical database 138. In the example shown in FIG. 5 the historical database 138 is represented by a cloud storage-based system. In this example there are historical images 500 and associated meta-data 502 which are uploaded into the historical database 138. The historical images 500 and associated meta-data 502 are then pre-processed and clustered and then stored in the historical database 138. This shows an accumulative database for various scanners and various protocols representing the various scan parameters and various scan geometries. Upon use the magnetic resonance imaging system 100 may then send a set of scan parameters 142 to the database 138. In response the database finds a historical image 146 which is then returned to it.

FIG. 5 provides a schematic overview over data collection and retrieval for one example. Each participating hospital is reporting performed exams by uploading all relevant information. The combined uploaded data is then processed and clustered into representative groups, the results are stored in a secondary database. Upon changing parameter in an ExamCard, the system can query this database to retrieve a representative image of an older acquisition, allowing to estimate the effect of the updated parameter.

In some examples a number of magnetic resonance imaging systems are connected to the historical database and that relevant information about the examination (ExamCard, manually selected protocol parameters and anatomy, but also patient age and gender among others) are send to the historical database, where they are stored together with the type and configuration of the scanner. In some examples, an anonymized version of the image is available for further computation if necessary. The images may also be stored in the historical database, but it would also be possible to keep the images in the hospitals and only store the URL of such images. The actual image is only retrieved (in anonymized form) on demand. It may also be possible to send a single, but characteristically slice only (for example the central slice, calculated by some algorithm) to the historical database to reduce bandwidth and storage requirements. Such algorithms may also operate on the historical database.

FIG. 5 shows a schematic overview over the proposed workflow. Each participating hospital is reporting performed exams by uploading the data to the cloud based system. The information sent includes the exact parameter used to acquire the scan, meta-data about the exam as well as a representative image for each diagnostic scan (i.e. the most representative slices or a specific anatomical feature extracted through automated segmentation algorithms). In the cloud based system, at least some of the uploaded scans are then processed and clustered based on the exact parameter used during the acquisition. For each resulting cluster a representative slice is selected (as an example).

Figure 6:
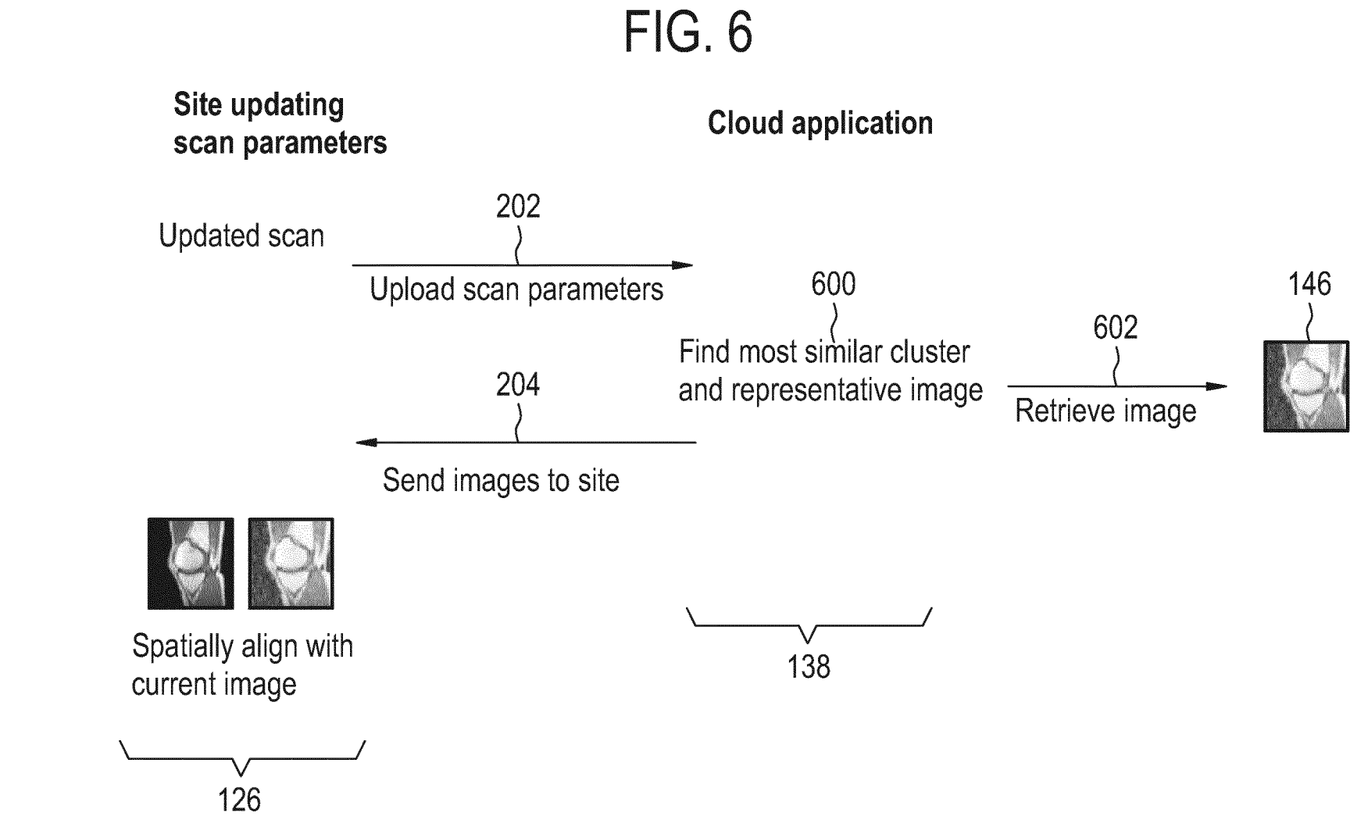
FIG. 6 illustrates a method of updating scan parameters.

FIG. 6 illustrates several operations performed by the computer system 126 or the magnetic resonance imaging system 100 and a cloud application which is represented by the historical database 138. First, the magnetic resonance imaging system updates the scan and then uploads the scan parameters 202. The historical database 138 then finds the most similar cluster of images and finds a representative image in step 600. Next in step 602 the historical database 138 retrieves the historical image data 146. Next in step 204, the historical database 138 sends the historical image data 146 to the magnetic resonance imaging system 100. It may also send it to a computer system 126 without a magnetic resonance imaging system. On the user interface 132 the previously acquired image may be aligned with the historical image 146.

FIG. 6 shows one possible workflow for retrieving the data from a cloud based system. The application sends the updated scan parameter. The cloud application identifies the corresponding cluster and returns the identified image. The local application spatially aligns the image to the currently shown one to minimize irritations.

In some examples, for all available scan parameter sets, an algorithm running on the historical database, calculates clusters of similar sets by using known clustering algorithms. In principle, such algorithms use a "distance measure" for scans and a minimum "variation" of those parameters within the clusters to determine some optimal clustering. Also prior knowledge (from MRI experts) can be included to better guide the optimization process. The algorithms updates the cluster information when new sets are store in the database.

For some initial ExamCard and after each parameter update, the local console can then query this cumulative database given the current set of parameter and retrieve a representative images. These images allow for a quick estimate of how an acquired image could potentially look like.

As described above, FIG. 6 shows one possible image retrieval workflow in more detail. Here the local application sends the updated parameter set to the cloud based application, which in turn identifies the closes matching cluster along with the representative image. This image is then returned to the client where it is spatially aligned to the currently displayed image to provide a better visual comparison. Here the fast and robust rigid image registration method could be applied. Of course, the spatial alignment of the images cannot guarantee perfect alignment since the images originate from different patients, but the aim of this task is to provide a more "consistent" viewing of the images.

In one example, the system is implemented as a cloud based ExamCard management solution allowing to manage the installed ExamCards on a fleet of MRI scanner as well as to update the parameter within those ExamCards.

In another example, the calculation of representative images may not only be calculated for the new value of the parameter, but also incrementally within the range from the old to the new value. In the user interface the use may then use a slider the continuously scan through all images within the parameter range.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 user interface
134 computer storage
136 computer memory
138 historical database
140 initial pulse sequence commands
142 set of selected pulse sequence parameters
144 image data request
146 historical image data
148 portion of historical image data
150 scan input modifications
152 modified pulse sequence commands
154 magnetic resonance data
156 magnetic resonance image
160 machine executable instructions
200 receive a set of selected pulse sequence parameters comprising a definition of a region of interest of a subject
202 send an image data request comprising the pulse sequence parameters to a historical database
204 receive historical image data from the historical database in response to the image data request
206 display at least a portion of the historical image data on a user interface
208 receive scan input modifications in response to displaying the historical image data from the user interface
210 generate modified pulse sequence commands using the initial pulse sequence commands, the set of pulse sequence parameters, and the scan input modifications
212 control the magnetic resonance imaging system to acquire the magnetic resonance data using the modified pulse sequence commands
300 portion of user interface display
302 first meta-data axis
304 second meta-data axis
306 historical image
308 historical image
310 historical image
312 historical image
314 historical image
400 acquired magnetic resonance image
402 historical image
404 portion of user interface
500 historical image
502 meta-data
600 find most similar cluster and representative image
602 retrieve image

The invention claimed is:

1. A magnetic resonance imaging system for acquiring magnetic resonance data from an imaging zone, wherein the magnetic resonance imaging system comprises:
a memory for storing initial pulse sequence commands and machine executable instructions, wherein the initial pulse sequence commands comprises adjustable timings and adjustable parameters; and
a processor for controlling the magnetic resonance imaging system;
wherein execution of the machine executable instructions causes the processor to:
receive a set of selected pulse sequence parameters comprising a definition of a region of interest of a subject, wherein the set of selected pulse sequence parameters comprises the adjustable timings and the adjustable parameters of the initial pulse sequence commands, wherein the region of interest is configured for being within the imaging zone;
send an image data request to a historical database, wherein the image data request comprises the set of selected pulse sequence parameters, wherein the historical database comprises multiple image data entries, wherein each image data entry comprises a set of historical pulse sequence parameters, wherein the historical database is configured to search the historical database to retrieve the historical image data by matching the set of selected pulse sequence parameters to the set of historical pulse sequence parameters;
receive historical image data from the historical database in response to the image data request;
display at least a portion of the historical image data on a user interface;
receive scan input modifications in response to displaying the at least a portion of the historical image data on the user interface;
generate modified pulse sequence commands using the initial pulse sequence commands, the set of selected pulse sequence parameters, and the scan input modifications; and
control the magnetic resonance imaging system to acquire the magnetic resonance data using the modified pulse sequence commands.

2. The magnetic resonance imaging system of claim 1, wherein the matching the set of selected pulse sequence parameters to the set of historical pulse sequence parameters is performed using a clustering algorithm.

3. The magnetic resonance imaging system of claim 1, wherein the historical image data comprises a closest historical image, and wherein the historical database is configured for selecting the closest historical image by comparing the pulse sequence parameters to the set of historical pulse sequence parameters using a metric.

4. The magnetic resonance imaging system of claim 1, wherein execution of the machine executable instructions causes the processor to display the closest historical image on the user interface.

5. The magnetic resonance imaging system of claim 1, wherein the historical image data comprises multiple historical images, wherein the step of displaying at least a portion of the historical image data on the user interface comprises displaying the multiple historical images on the user interface.

6. The magnetic resonance imaging system of claim 5, wherein each of the multiple historical images comprises meta-data, wherein the step of receiving scan input modifications in response to displaying the historical image data from the user interface comprises a selection of one of the multiple historical images, wherein execution of the machine executable instructions causes the processor to update the set of selected pulse sequence parameters using the set of historical pulse sequence parameters.

7. The magnetic resonance imaging system of claim 6, wherein execution of the machine executable instructions further causes the processor to automatically highlight of one of the multiple historical images on the user interface by searching the meta-data for each of the multiple historical images for a best value that matches a selection criterion, and wherein the best value is the meta-data for the one of the multiple historical images.

8. The magnetic resonance imaging system of claim 6, wherein each of the multiple historical images comprises meta-data, wherein execution of the machine executable instructions further causes the processor to automatically select of one of the multiple historical images by searching the meta-data for each of the multiple historical images for a best value that matches a selection criterion, and wherein the best value is the meta-data for the one of the multiple historical images, wherein execution of the machine executable instructions causes the processor to update the set of selected pulse sequence parameters using the set of historical pulse sequence parameters for the one of the multiple historical images.

9. The magnetic resonance imaging system of claim 6, wherein the meta-data comprises any one of the following: scan time, signal to noise, contrast, contrast to noise, success of a preselected segmentation algorithm, success of a predetermined measurement algorithm, and combinations thereof.

10. The magnetic resonance imaging system of claim 6, wherein execution of the machine executable instructions further causes the processor to arrange the multiple historical images on the user interface along one or more axis determined by the meta-data.

11. The magnetic resonance imaging system of claim 6, wherein the meta-data comprises scan time, wherein execution of the machine executable instructions causes the processor to arrange the multiple historical images on the user interface along a scan time axis.

12. The magnetic resonance imaging system of claim 1, wherein execution of the machine executable instructions further cause the processor to:
generate preliminary pulse sequence commands using the initial pulse sequence commands;
control the magnetic resonance imaging system to acquire preliminary magnetic resonance data using the preliminary pulse sequence commands;
reconstruct a preliminary magnetic resonance image using the preliminary magnetic resonance data;
display the preliminary magnetic resonance image on the user interface; and
receive an image correction request from the user interface in response to displaying the preliminary magnetic resonance image, wherein the sending of the image data request to the historical database is made in response to receiving the image correction request.

13. A computer program product comprising machine executable instructions for execution by a processor, wherein execution of the machine executable instructions causes the processor to:
receive a set of selected pulse sequence parameters comprising a definition of a region of interest of a subject, wherein the set of selected pulse sequence parameters comprises adjustable timings and adjustable parameters of initial pulse sequence commands, wherein the region of interest is configured for being within the imaging zone;
sending an image data request to a historical database, wherein the image data request comprises the pulse sequence parameters;
receive historical image data from the historical database in response to the image data request, wherein the historical database comprises multiple image data entries, wherein each image data entry comprises a set of historical pulse sequence parameters, wherein the historical database is configured to search the historical database to retrieve the historical image data by matching the set of selected pulse sequence parameters to the set of historical pulse sequence parameters;
display at least a portion of the historical image data on a user interface;
receive scan input modifications in response to displaying the historical image data from the user interface; and
generate modified pulse sequence commands using the initial pulse sequence commands, the set of selected pulse sequence parameters, and the scan input modifications.

14. A method of operating a magnetic resonance imaging system, wherein the method comprises:
receiving a set of selected pulse sequence parameters comprising a definition of a region of interest of a subject, wherein the set of selected pulse sequence parameters comprises adjustable timings and adjustable parameters for initial pulse sequence commands, wherein the region of interest is configured for being within the imaging zone;
sending an image data request to a historical database, wherein the image data request comprises the pulse sequence parameters, wherein the historical database comprises multiple image data entries, wherein each image data entry comprises a set of historical pulse sequence parameters, wherein the historical database is configured to search the historical database to retrieve the historical image data by matching the set of selected pulse sequence parameters to the set of historical pulse sequence parameters;
receiving historical image data from the historical database in response to the image data request;
displaying at least a portion of the historical image data on a user interface;
receiving scan input modifications in response to displaying the historical image data from the user interface;
generating modified pulse sequence commands using the initial pulse sequence commands, the set of selected pulse sequence parameters, and the scan input modifications; and
controlling the magnetic resonance imaging system to acquire the magnetic resonance data using the modified pulse sequence commands.

* * * * *